United States Patent
Lee et al.

(10) Patent No.: US 7,989,750 B2
(45) Date of Patent: Aug. 2, 2011

(54) IMAGE SENSORS WITH ENHANCED CHARGE TRANSMISSION CHARACTERISTICS

(75) Inventors: Kang-bok Lee, Suwon-si (KR); Seok-ha Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/457,536

(22) Filed: Jun. 15, 2009

(65) Prior Publication Data

US 2009/0256061 A1 Oct. 15, 2009

Related U.S. Application Data

(62) Division of application No. 11/502,415, filed on Aug. 11, 2006, now Pat. No. 7,564,018.

(30) Foreign Application Priority Data

Aug. 12, 2005 (KR) .................. 10-2005-0074446

(51) Int. Cl.
*H01L 27/00* (2006.01)

(52) U.S. Cl. .................. 250/208.1; 348/308
(58) Field of Classification Search .......... 250/208.1; 348/308; 257/291–293, 316, 317
See application file for complete search history.

(56) References Cited

U.S. PATENT DOCUMENTS

| | | | |
|---|---|---|---|
| 2003/0193597 A1 | 10/2003 | Fossum et al. | |
| 2005/0030403 A1 | 2/2005 | Yaung et al. | |
| 2005/0110885 A1* | 5/2005 | Altice et al. | 348/308 |
| 2005/0205902 A1 | 9/2005 | Hara et al. | |
| 2006/0027843 A1 | 2/2006 | Ogura et al. | |
| 2006/0132633 A1 | 6/2006 | Nam et al. | |
| 2006/0175538 A1 | 8/2006 | Kim et al. | |

FOREIGN PATENT DOCUMENTS

| | | |
|---|---|---|
| JP | 2004-342912 | 12/2004 |
| KR | 10-2004-0093936 | 11/2004 |
| KR | 10-2004-0093947 | 11/2004 |

* cited by examiner

*Primary Examiner* — Georgia Y Epps
*Assistant Examiner* — Kevin Wyatt
(74) *Attorney, Agent, or Firm* — Harness, Dickey & Pierce, P.L.C.

(57) ABSTRACT

An image sensor includes photoelectric conversion elements formed adjacent to each other on a substrate. Two transmission elements transmit charge accumulated in two adjacent photoelectric conversion elements to a first floating diffusion region, and another two transmission elements transmit charge accumulated in the other two photoelectric conversion elements to a second floating diffusion region. The first floating diffusion region is electrically connected to the second floating diffusion region. A plurality of readout elements read out the charge transmitted to the first and the second floating diffusion regions. The image sensor also includes a dummy gate group including at least one dummy gate arrayed substantially parallel to a readout gate of the plurality of readout elements.

13 Claims, 7 Drawing Sheets

IMAGE SENSORS WITH ENHANCED CHARGE TRANSMISSION CHARACTERISTICS

PRIORITY STATEMENT

This non-provisional U.S. patent application is a divisional of U.S. application Ser. No. 11/502,415, filed on Aug. 11, 2006, now U.S. Pat. No. 7,564,018 which claims priority under 35 U.S.C. §119 to Korean Patent Application No. 10-2005-0074446 filed on Aug. 12, 2005 in the Korean Intellectual Property Office (KIPO), the entire contents of which is incorporated herein by reference.

BACKGROUND

Description of the Related Art

Image sensors convert optical images into electrical signals. Image sensors may be used in devices, such as, digital cameras, camcorders, personal communication systems (PCS), game devices, surveillance cameras, micro-cameras, robots, etc.

Related art metal oxide semiconductor (MOS) image sensors may be used in a variety of different scanning methods. In addition, related art MOS image sensors may integrate a signal processing circuit into a single chip providing a more compact product. Related art MOS image sensors may be manufactured using well-known MOS manufacturing processes. Because of lower power consumption, MOS image sensors may be applied to products with restricted battery capacity.

To satisfy augmented resolution as pixel integrity increases, the size of photoelectric conversion element per pixel may decrease. This may result in a drop in the sensitivity and/or the amount of saturated signals. As a result, a related art shared-pixel-structured image sensor may be applied to the MOS image sensor to enhance light receiving efficiency by increasing the size of the photoelectric conversion element. In related art shared-pixel-structured image sensors, a readout element is shared among most of photoelectric conversion elements.

For example, when four photoelectric conversion elements formed adjacent to each other in one direction share a readout element, charge that accumulates in two adjacent photoelectric conversion elements may be sent to a first floating diffusion region via two charge transmission devices, and charge that accumulates in the remaining two adjacent photoelectric conversion elements may be sent to a second floating diffusion region via the two charge transmission devices. In this example, the second floating diffusion region may be electrically connected to the first floating diffusion region. The readout element may be formed according to the first floating diffusion region.

The size of a transfer gate of the transfer device adjacent to the second floating diffusion region and that of a transfer gate of the transfer device adjacent to the first floating diffusion region may be different. Because most of readout elements are not formed in a region adjacent to the second floating diffusion region, a loading effect may occur when polysilicon layers deposited on a semiconductor substrate are etched to form transfer gates adjacent to the first and the second floating diffusion regions. The loading effect may be, for example, non-uniformity of an etching speed in the polysilicon layers induced by non-uniformity of an etching gas and/or etching solutions in the process of etching polysilicon layers.

Due to such size differences, the floating diffusion regions may have different transfer characteristics. In addition, because a transfer gate is formed between each photoelectric conversion element and the floating diffusion region, if the transfer gates are different sizes, each active region forming each photoelectric conversion element may have a different size. This may result in non-uniform sensitivity and/or a non-uniform amount of saturated signals.

SUMMARY

Example embodiments described herein provide image sensors with enhanced charge transmission characteristics.

According to an example embodiment, an image sensor may include a plurality of photoelectric conversion elements formed adjacent to each other on a substrate. Two of the plurality of transmission elements may transmit charges accumulated in two adjacent photoelectric conversion elements to a first floating diffusion region, and another two of the plurality of transmission elements may transmit charges accumulated in another other two photoelectric conversion elements to a second floating diffusion region. The second floating region may be electrically connected to the first floating diffusion region. A plurality of readout elements may be formed corresponding to the first floating diffusion region and may read charges transmitted to the first and the second floating diffusion regions. A dummy gate group may be formed corresponding to the second floating diffusion region. The dummy gate group may include at least one dummy gate arrayed parallel or substantially parallel to a readout gate of the plurality of readout elements.

According to another example embodiment, an image sensor may include a substrate including one-axis merged dual-lobed actives and no-axis merged dual-lobed actives, which may be defined by an element isolation region. Transfer gates may be formed between dual-lobed actives and a connection active of the one-axis merged dual-lobed actives. A plurality of readout gates may be formed on an axis active of the one-axis merged dual-lobed active. Transfer gates may be formed between dual-lobed actives and a connection active of the no-axis merged dual-lobed active. A dummy gate group may include at least one dummy gate formed in an element isolation region adjacent to the connection active of the no-axis merged dual-lobed active.

According to another example embodiment, an image sensor may include a substrate including one-axis merged dual-lobed actives and no-axis merged dual-lobed actives. The one-axis merged dual-lobed actives and no-axis merged dual-lobed actives may be defined by an element isolation region. Transfer gates may be formed between dual-lobed actives and a connection active of the one-axis merged dual-lobed actives. A plurality of readout gates may be formed on an axis active of the one-axis merged dual-lobed active. Transfer gates may be formed between dual-lobed actives and a connection active of the no-axis merged dual-lobed active. The image sensor may further include a dummy active adjacent to the no-axis merged dual-lobed active and formed corresponding to the axis active of the one-axis merged dual-lobed active.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
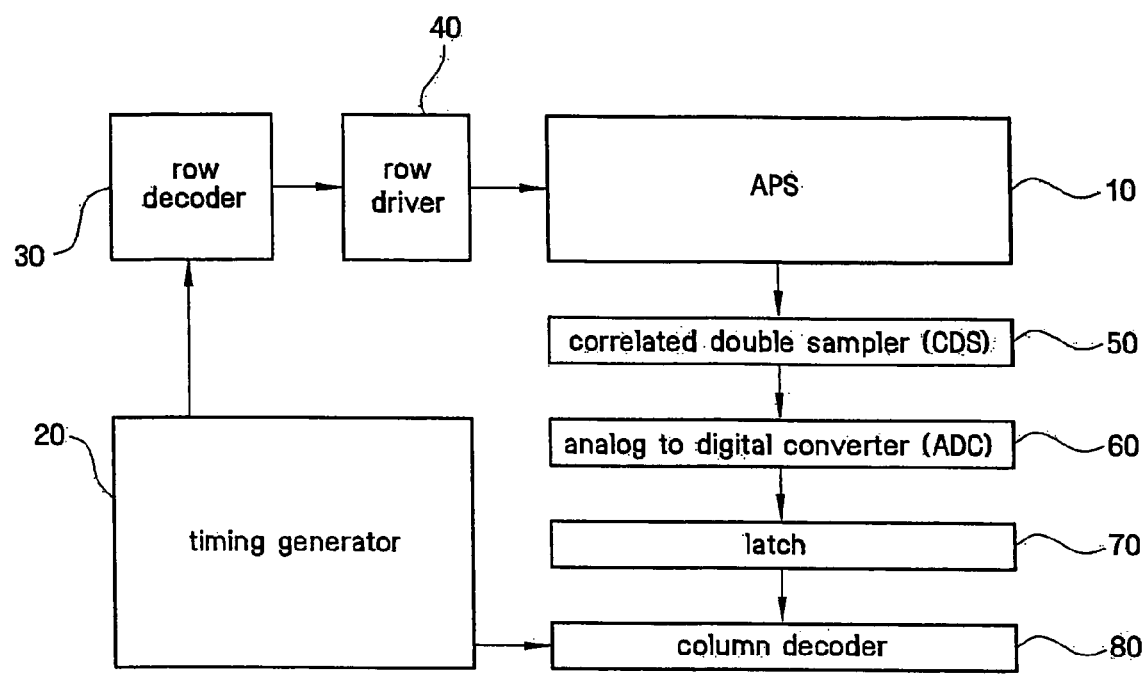
FIG. 1 is a block diagram illustrating an image sensor, according to an example embodiment of the present invention.

The present invention may be understood more readily by reference to the following detailed description of exemplary embodiments and the accompanying drawings. The present invention may, however, be embodied in many different forms and should not be construed as being limited to the exemplary embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

The example embodiments of the present invention have been explained with reference to the accompanying drawings, but it will be apparent to those skilled in the art that various modifications and changes may be made thereto without departing from the scope and spirit of the present invention. Therefore, it should be understood that the example embodiments are not restrictive but illustrative in all aspects.

In the following description, the term "and/or" includes each and at least one combination of the referenced items.

It should be noted that the use of any and all examples, or exemplary terms provided herein is intended merely to better illuminate the present invention and is not a limitation of the scope of the present invention unless otherwise specified. The use of the terms "a" and "an" and "the" and similar referents in the context of describing the present invention (especially in the context of the following claims) are to be construed to cover both singular and plural entities, unless otherwise indicated herein or clearly contradicted by the context. The terms "comprising," "having," "including," and "containing" are to be construed as open-ended terms (i.e., meaning "including, but not limited to,") unless otherwise noted.

In the following example embodiments, image sensors are exemplified using a CMOS image sensor. However, the image sensors, according to at least some example embodiments, may include an image sensor formed by applying a negative-channel metal oxide semiconductor (NMOS) or a positive-channel metal oxide semiconductor (PMOS) process, or by applying a complementary metal oxide semiconductor (CMOS) process using both NMOS and PMOS processes.

FIG. 1 is a block diagram illustrating an image sensor, according to an example embodiment of the present invention.

Referring to FIG. 1, an image sensor may include an active pixel sensor (APS) array 10 in which pixels may be arrayed in at least two dimensions. The pixels may be comprised of photoelectric conversion elements. The image sensor of FIG. 1 may further include a timing generator 20, a row decoder 30, a row driver 40, a correlated double sampler (CDS) 50, an analog to digital converter (ADC) 60, a latch 70 and/or a column decoder 80.

As discussed above, the APS array 10 may include a plurality of pixels arrayed in at least two dimensions. According to at least some example embodiments, the APS array 10 may be in the form of a matrix having a plurality of shared pixels (e.g., four shared pixels) including, for example, a plurality of photoelectric conversion elements (e.g., four) as a repeating unit. The example embodiment shown in FIG. 1 will be described as including an APS array 10 having four shared pixels. When the four shared pixels are used, the size of a readout element may be reduced thereby enhancing absorption efficiency, photosensitivity and/or the amount of saturated signals. The readout element may amplify the size of the photoelectric conversion element, The four shared pixels of the APS array 10 may convert an optical image into one or more electrical signals. The APS array 10 may be driven by a plurality of driving signals such as a pixel selection signal (SEL), a reset signal (RX) and/or a charge transmission signal (TX). The at least one electrical signal generated by the APS array 10 may be output to the correlated double sampler (CDS) via a signal line (e.g., a perpendicular signal line).

The timing generator 20 may output at least one output signal to each of the row decoder 30 and the column decoder 80. For example, the timing generator 20 may output a timing signal and a control signal to the row decoder 30 and the column decoder 80. The row decoder 30 may output decoding results to the row driver 40 in response to the at least one output signal from the timing generator 20.

The row driver 40 may output a plurality of drive signals to drive a plurality of pixels in the APS array 10 according to the decoding results output from the row decoder 30. When the pixels in the APS array 10 are arrayed in the form of the matrix, the row driver 40 may provide drive signals to each row of the matrix.

As discussed above, the CDS 50 receives at least one electrical signal generated by the APS array 10 through a signal line. The CDS 50 may hold and sample the at least one electrical signal. For example, the CDS 50 may doubly sample a particular noise level and signal level of an electrical signal corresponding to the electrical signal and may output the difference between the noise level and the signal level as a difference level. The different level may be output as an analog signal.

The ADC 60 may convert the analog different signal into a digital difference signal and output the digital difference signal to the latch 70. The latch 70 latches the digital difference signal, and the latched signal may be sent to the column decoder 80, and from the column decoder 80 to an image signal processor (not shown) based on decoding results at the column decoder 80.

Figure 2:
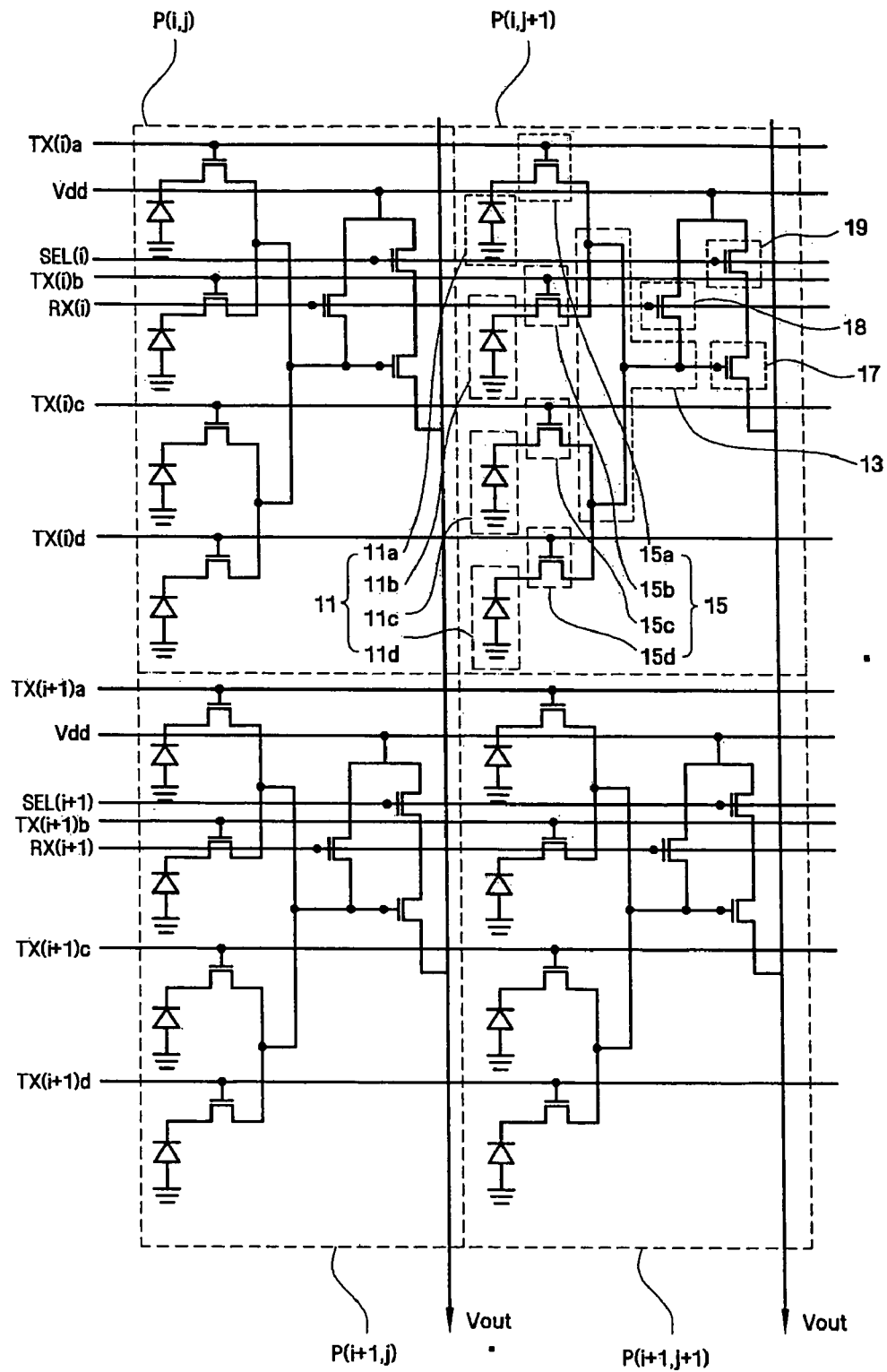
FIG. 2 is an equivalent circuit diagram of an image sensor, according to an example embodiment of the present invention.

FIG. 2 is an equivalent circuit diagram of an image sensor, according to an example embodiment of the present invention.

According to FIG. 2, a four-shared pixel (P) may be arrayed in a matrix to form the APS array 10 of FIG. 1. The four photoelectric conversion elements in the shared pixel (P) structure may share readout elements. The readout elements mentioned herein refer to elements that read optical signals transmitted to the photoelectric conversion elements, including, for example, a drive element, a reset element and/or a selection element.

For example, the four-shared pixel may include a plurality of photoelectric conversion elements (e.g., 4) 11a, 11b, 11c and/or 11d. The four photoelectric conversion elements may absorb incident light and accumulate electric charge proportional to absorbed incident light. A photodiode, a phototransistor, a photogate, pinned photodiode, a combination thereof, etc. may be applied to the photoelectric conversion elements 11a, 11b, 11c and/or 11d. Photodiodes are illustrated in the figures for example purposes.

The photoelectric conversion elements 11a, 11b, 11c and/or 11d may be electrically connected to charge transmission elements 15a, 15b, 15c and/or 15d, which may transfer the accumulated charge to a floating diffusion region (FDR) 13. Due to parasitic capacitance in the FDR 13, charge may accumulate producing a voltage.

The photoelectric conversion elements 11a, 11b, 11c, and 11d in the shared pixel may share the readout elements such as drive element 17, reset element 18 and/or selection element 19. Example functions of pixels will be described using the pixels in row I [P(i,j), P(i,j+1), . . . ].

The driver element 17, shown, for example, as a source-follower amplifier, may amplify the potential difference in the FDR 13, and output the amplified potential difference via an output line (Vout).

The reset element 18 may reset (e.g., periodically reset) the FDR 13. The reset element 18 may include, for example, a single MOS transistor driven by a bias signal from a bias. The bias signal may be provided by a reset line (RX (i)). When the reset element 18 is turned on by the, a drain in the reset element 18 and an electric potential (e.g., a source voltage (VDD)) may be sent to the FDR 13.

The selection element 19 may include, for example, a single MOS transistor driven by a bias signal from the bias. The bias signal may be provided by a row select line (SEL(i)). The selection element 19 may select the shared pixels to read a row. When the selection element 19 is turned on by the bias, a drain in the selection element 19 and an electric potential, (e.g., a source voltage (VDD)) may be sent to a drain region in the drive element 17.

Transfer lines TX(i)a, TX(i)b, TX(i)c, and TX(i)d supplying a bias signal to the charge transmission elements 15a, 15b, 15c and 15d, a reset line RX(i) supplying a signal to the reset element 18 and/or a row select line SEL(i) supplying a bias signal to the selection element 19 may be arrayed, for example, laterally in such that they are parallel to each other.

Figure 3:
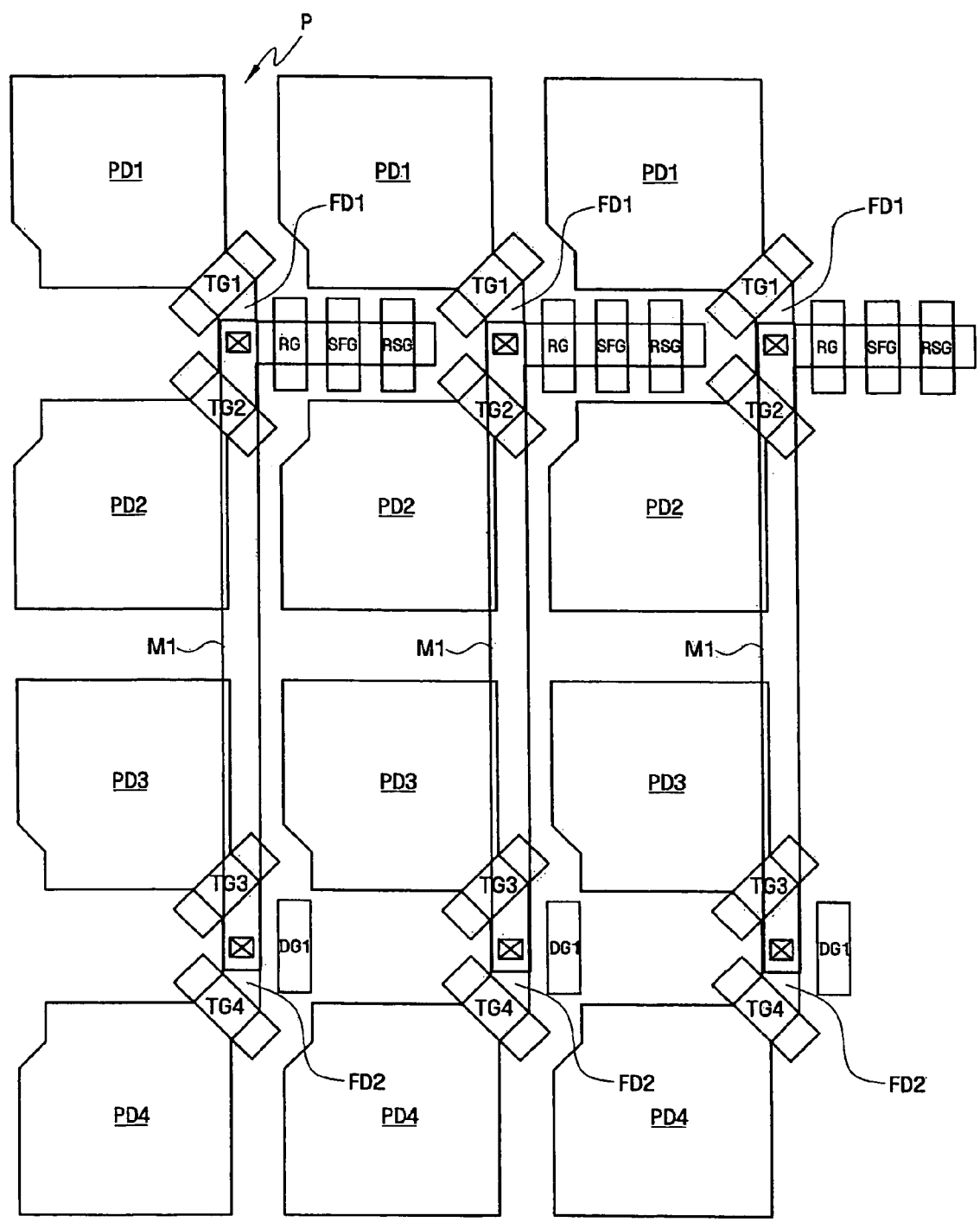
FIG. 3 illustrates an APS array, according to an example embodiment of the present invention.
Figure 4:
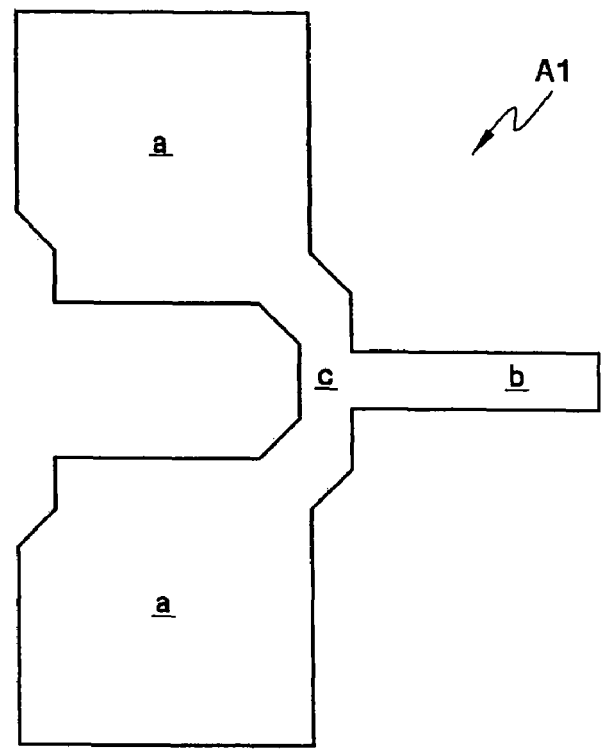
FIG. 4 illustrates a layout of a shared pixel active, according to another example embodiment of the present invention.
Figure 4:
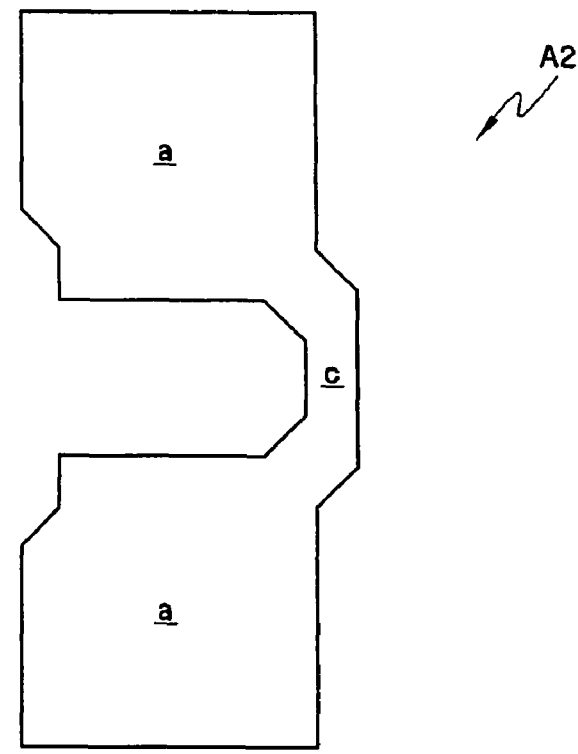

FIG. 3 illustrates an APS array of an image sensor, according to an example embodiment. FIG. 4 illustrates a layout of the shared active pixel, according to an example embodiment.

According to FIG. 3 and FIG. 4, a plurality of shared pixels may be arrayed in the form of a matrix. In the shared pixel (P) structure, a plurality of (e.g., four) photoelectric conversion elements PD1, PD2, PD3 and PD4 may be formed adjacent to each other in one direction and may share a plurality of readout elements. For example, two adjacent photoelectric conversion elements PD1 and PD2 may share a first floating diffusion region FD1, and two adjacent photoelectric conversion elements PD3 and PD4 may share a second floating diffusion region FD2. FD1 and FD2 may be electrically connected to an interconnect layer M1. In at least one example embodiment, FD1 and FD2 may be spatially isolated and electrically connected such that even though the readout elements are formed spatially closer to FD1, the readout elements may read all or substantially all charge transmitted to both FD1 and FD2. The plurality of readout elements refer to an element that reads charge transmitted to FD1 and FD2 such as a reset element, a drive element, and/or a selection element.

Referring now to both FIG. 3 and FIG. 4, in the shared pixel (P) structure, two photoelectric conversion elements PD1 and PD2, the FD1 and a plurality of the readout elements may be formed in a first active region A1 (shown in FIG. 4) while two photoelectric conversion elements PD3 and PD4, and the FD2 may be formed in a second active region A2 (shown in FIG. 4).

As shown in FIG. 4, A1 is a one-axis merged dual-lobed active region while A2 is a no-axis merged dual-lobed active region. For example, in A1 each lobe (a) may be connected to an active axis region (b) through a connection active region (c). The lobes (a) may be arrayed in one direction facing each other (e.g., in a column direction) according to the axis (b). The appearance of the one-axis merged dual-lobed active region may be similar or substantially similar to hypocotyls of a young dicotyledon and a dual cotyledon separated therefrom. The lobes (a) may form a dual photoelectric conversion element active in which two photoelectric conversion elements PD1 and PD2 may be formed, and the connection active region (c) may be the active FD1. If the FD1 is shared between the PD1 and the PD2, the size of the connection active region (c), in which the FD1 may be formed, may decrease. Consequently, a parasitic capacitance may also decrease and charge transmitted to the FD1 may produce a drive voltage of a drive element.

Referring back to FIG. 3, a transfer gate TG1 may be formed between the upper lobe (a) (e.g., PD1) and the connection active region (c), and a transfer gate TG2 may be formed between the lower lobe (a) (e.g., PD2) and the connection active (c) so that charge accumulated in PD1 and PD2 may be transmitted to FD1. In addition, a plurality of readout gates RG, SFG and RSG may be formed on the axis active (b) connected with the connection active (c) for reading charge transmitted to FD1. The plurality of readout gates may include a reset gate (RG), a drive gate (SFG) and/or a selection gate (RSG). The readout gates RG, SFG and RSG may include be formed in parallel in one direction.

Referring again to FIG. 4, in A2 upper and lower lobes (a) may be connected to an active axis region (b) through a connection active region (c). The lobes (a) may be arrayed in one direction facing each other (e.g., in a column direction). The lobes (a) may form a dual photoelectric conversion element active region in which two photoelectric conversion elements PD3 and PD4 may be formed. The connection active region (c) may serve as the active region FD2. If FD2 is shared between PD3 and PD4, the size of the connection active region (c), in which the FD2 is formed, may decrease. Consequently, a parasitic capacitance may decrease and charge transmitted to FD2 may produce a drive voltage of a drive element.

Referring back to FIG. 3, transfer gate TG3 may be formed between the upper lobe (a) (e.g., PD3) and the connection active region (c), and transfer gate TG4 may be formed between the lower lobe (a) (e.g., PD4) and the connection active region so that charge accumulated in PD3 and PD4 may be transmitted to FD2. Because FD1 is electrically connected with FD2 via M1, charge transmitted to FD2 may be read via the plurality of readout elements formed along axis (b).

In example embodiments of the present invention, a dummy gate (DG1) may be formed in the connection active region (c) of the no-axis dual-lobed active and/or in an element isolation region adjacent to FD2. Dummy gate DG1 may be arrayed or substantially arrayed in parallel with the readout gates RG, SFG and RSG, which may be formed in the axis active region (b) of the one-axis dual-lobed active. "Substantially arrayed" refers to not only when the RG, the SFG, the RSG are arrayed in parallel with dummy gate DG1, but also when the readout gates and the DG1 may be somewhat misaligned.

Dummy gate DG1 may be enable the transfer gates TG1, TG2, TG3 and/or TG$ to have similar or substantially similar sizes (e.g., substantially similar in length and width).

For example, dummy gate DG1 may assist in suppressing occurrence of a loading effect when polysilicon layers deposited on a semiconductor substrate are etched in order to form transfer gates and/or readout gates. As discussed above, a loading effect may be non-uniformity of an etching speed in the polysilicon layers, induced by non-uniformity in the etching gas and/or etching solutions when etching polysilicon layers. The loading effect may vary according to whether a pattern being etched is present in surrounding polysilicon layers. For example, on the same or substantially the same sized gate patterns, more polysilicon layers may be etched without a surrounding etching gate pattern as compared to a surrounding gate etching pattern is present.

A dummy gate DG1 may enable the etching speed of TG3 and TG4 to be similar or substantially similar to that of the TG1 and the TG2. For example, the size of TG3 and TG4 may be similar or substantially similar to that of the TG1 and TG2.

The readout gate situated closest to the transfer gates has a greater influence on the occurrence of the loading effect. As a result, dummy gate DG1 may be arrayed in parallel with the readout gate closest to the transfer gate. As shown in FIG. 3, for example, dummy gate DG1 may be arrayed in parallel or substantially parallel to readout gate RG. However, the present invention is not limited to this example embodiment. For example, alternatively, readout gates SFG and/or RSG may be arrayed in parallel or substantially parallel to dummy gate DG1.

According to at least this example embodiment, charge may be more regularly and/or uniformly transferred from the photoelectric conversion elements PD1, PD2, PD3 and/or PD4 to FD1 and/or FD2 because each transfer gate TG1 and TG2 has a similar or substantially similar width (e.g., the length of the channel). In addition, because the dual-lobed active regions (a) forming the photoelectric conversion elements, are the same or substantially the same size, sensitivity and/or amount of the saturated signals may be more stable.

Figure 5:
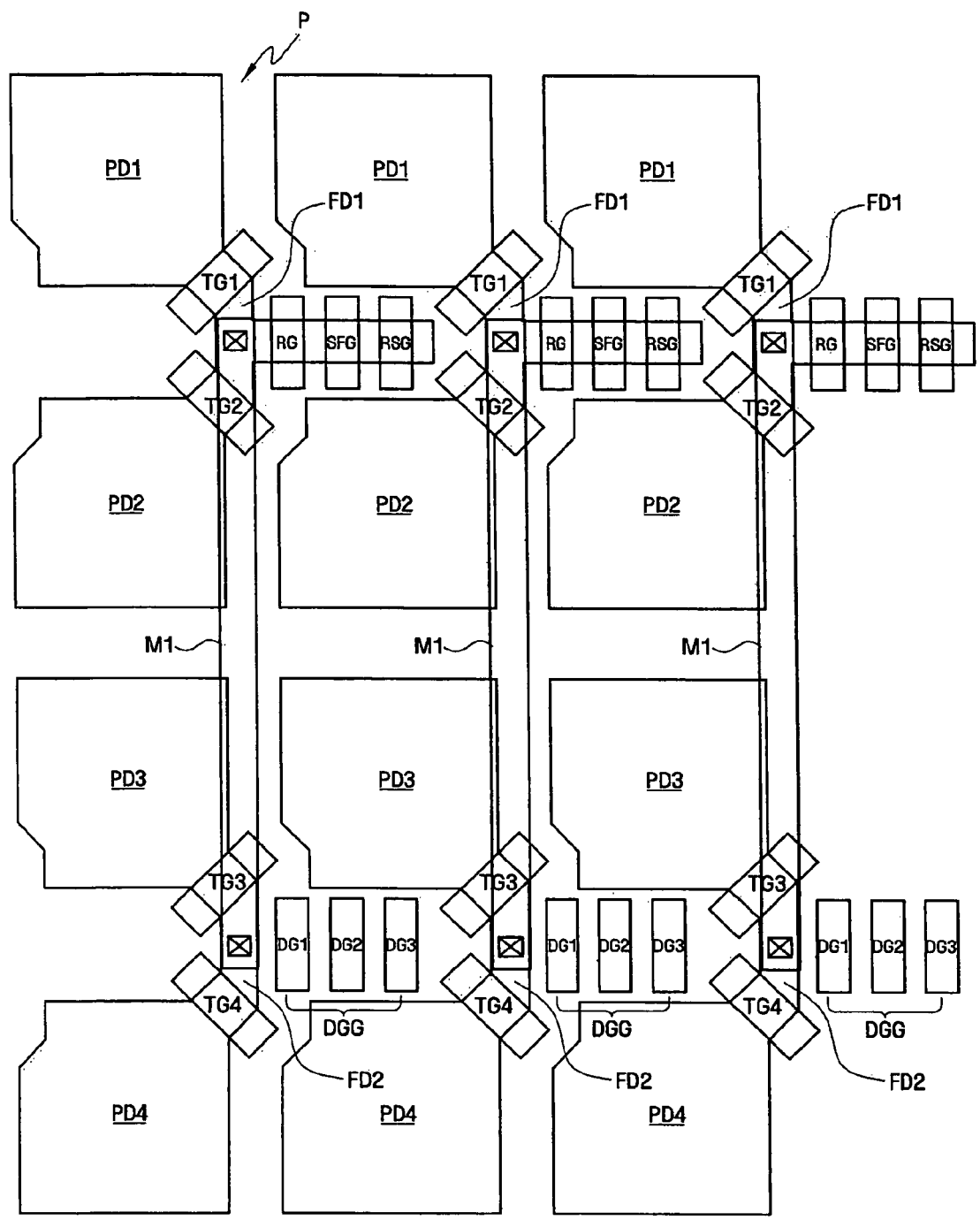
FIG. 5 illustrates an APS array, according to another example embodiment of the present invention.

FIG. 5 illustrates an APS array of an image sensor, according to another example embodiment. Like reference numerals designate like elements in FIG. 3, and previously described details thereof, have been omitted for the sake of brevity.

According to FIG. 5, the shared pixels, for example, a repeating unit of the APS array of the image sensor according to another example embodiment, may include readout gates RG, SFG and RSG, and/or a dummy gate group (DGG) including a plurality of dummy gates DG1, DG2 and/or DG3, which may be arrayed in a row.

In this example embodiment, when dummy gates DG1, DG2, and DG3 may be arrayed parallel or substantially parallel to RG, SFG, and RSG, as shown in FIG. 5, the surrounding patterns, formed near TG3 and TG4, may be the same or substantially the same as the surrounding pattern, for example, the readout gates RG, SFG and RSG formed near TG1 and TG2.

Although not illustrated, the shared pixel array may include a dummy gate group DGG including two dummy gates DG1 and DG2 arrayed parallel or substantially parallel to RG, SFG and/or RSG. For example, the shared pixels may include two dummy gates, DG1 and DG2, arrayed parallel or substantially parallel to RG and SFG, RG and RSG or SFG and RSG.

Figure 6:
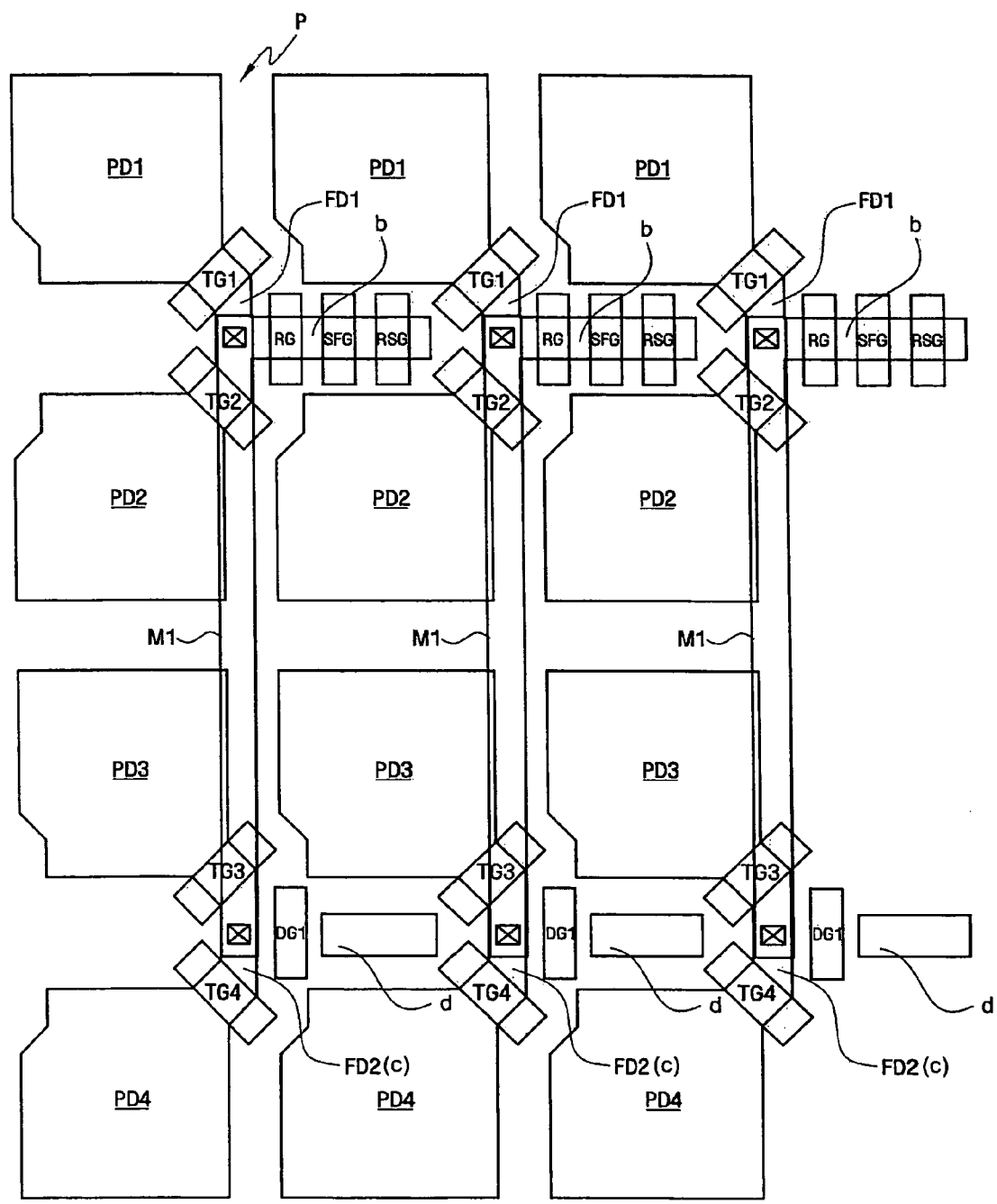
FIG. 6 illustrates an APS array, according to another example embodiment of the present invention.

FIG. 6 illustrates an APS array of an image sensor, according to another example embodiment. According to FIG. 6, in the APS array, a shared pixel may be adjacent to an active region (c) of the no-axis merged dual-lobed active, and may include a dummy active region (d) formed to correspond to axis (b) of an one-axis merged dual-lobed active region. The dummy active (d) may also help suppress a loading effect from occurring, and may be able to make the sizes of the one-axis merged dual-lobed active region and the no-axis dual lobed active region equal or substantially equal. However, the length of the dummy active region (d) may be shorter than that of the axis (b). In addition, the shared pixel may further include at least one dummy gate DG1 between the dummy active region (d) and the connection active region (c). In at least this example embodiment of the present invention, at least one dummy gate DG1 may be arrayed parallel or substantially parallel to at least one of readout gates RG, SFG and RSG.

Figure 7:
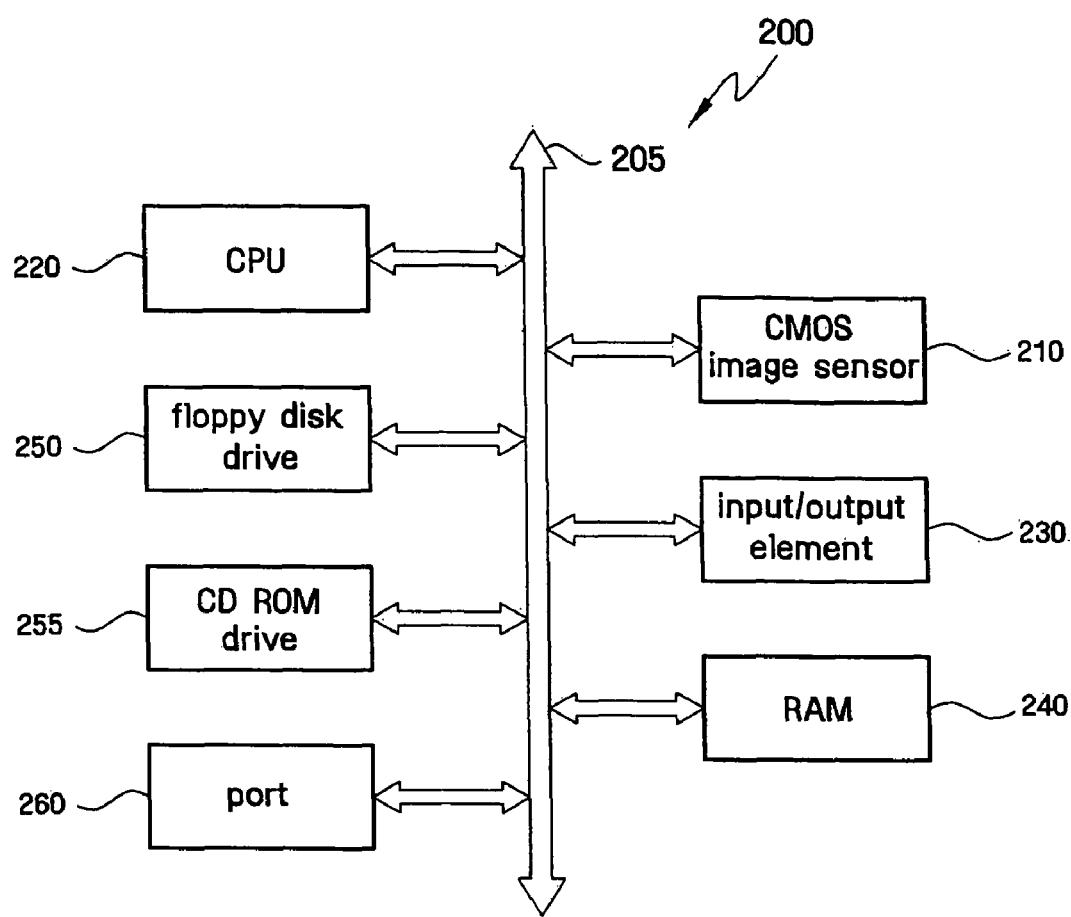
FIG. 7 illustrates a processor-based system including an image sensor, according to an example embodiment of the present invention.

FIG. 7 illustrates a processor-based system including an image sensor, according to an example embodiment. According to FIG. 7, a processor-based system 200 may process an output image from an image sensor (e.g., an MOS or CMOS image sensor) 210. The system 200 may be, for example, a computer system, a camera system, a scanner, a mechanized clock system, a navigation system, a video phone, an automatic focus system, a tracking system, a motion detection system, an image stabilizing system, etc.

The processor-based system 200 may include a central processing unit (CPU) (e.g., a microprocessor) 220 which may communicate with an input/output element 230 via a bus 205. The image sensor 210 may communicate with the system 200 via bus 205 or any other telecommunication link. The system 200 may further include at least one random access memory (RAM) 240 which communicates with the CPU 220 via bus 205, a floppy disk drive 250, a CD ROM drive 255, and/or a port 260. The port 260 may couple a video card, a sound card, a memory card, a USB element, and/or transmit data to other systems. The image sensor 210 may be integrated with the CPU, a digital signal processor, a microprocessor, a memory, etc. The image sensor 210 may also be integrated into chips other than the processor.

In image sensors, according to at least some example embodiments of the present invention, charge transmission characteristics of first and second floating regions in each photoelectric conversion element may be the same or substantially the same because a plurality of transfer gates may have the same or substantially the same size. In addition, the sensitivity and the amount of saturated signals may be more uniform because dual-lobed active regions forming photoelectric conversion elements are the same or substantially the same size.

Although example embodiments of the present invention have been described with regard to a CMOS image sensor, image sensors, according to example embodiments of the present invention, may be any suitable image sensor, for example, any type of MOS-based image sensor.

Example embodiments of the present invention have been described with reference to the accompanying drawings, but it will be apparent to those skilled in the art that various modifications and changes may be made thereto without departing from the scope and spirit of the present invention. Therefore, it should be understood that the above example embodiments are not restrictive but illustrative in all aspects.

What is claimed is:

1. An image sensor comprising:
a substrate including at least a first and a second dual-lobed active region, the first and the second dual-lobed active region spatially isolated from each other;
a first transfer gate formed between each lobe of the first dual-lobed active region and a first connection active region of the first dual-lobed active region;
a plurality of readout elements formed on an axis active region of the first dual-lobed active region;
a second transfer gate formed between each lobe of the second dual-lobed active region and a second connection active region of the second dual-lobed active region; and
at least one dummy gate group including at least one dummy gate formed in an element isolation region adjacent to the second connection active region, wherein
the at least one dummy gate group includes a plurality of dummy gates including the at least one dummy gate, the plurality of dummy gates being substantially parallel to the plurality of readout elements, and
a number of the plurality of dummy gates equals a number of the plurality of readout elements.

2. The image sensor of claim 1, wherein the plurality of the readout elements are formed in parallel.

3. The image sensor of claim 1, wherein the at least one dummy gate is arranged parallel or substantially parallel to one of the plurality of readout elements, the one of the plurality of readout elements being adjacent to the first transfer gates.

4. The image sensor of claim 1, wherein the first connection active region and the second connection active region are spatially isolated and electrically connected.

5. The image sensor of claim 1, wherein an interconnect layer electrically connects the first connection active region and the second connection active region.

6. The sensor of claim 1, wherein the lobes of the first dual-lobed active region are adjacent to one other in a first direction and the lobes of the second dual-lobed active region are adjacent to one another in the first direction.

7. The sensor of claim 6, wherein the first direction is a column direction.

8. The sensor of claim 1, further including a dummy active region that is adjacent to the second connection active region.

9. The sensor of claim 1, wherein the first dual-lobed active region and the second dual-lobed active region are defined by an isolation region.

10. An image sensor system comprising:
a timing generator configured to output at least one output signal;
a row decoder configured to output a first decoding signal based on the at least one output signal;
a row driver configured to output at least one driving signal based on the first decoding signal;
the image sensor of claim 1 configured to convert an optical image into an electrical signal based on the at least one driving signal;
a sampler for generating an analog signal representing a difference between a noise level and a signal level of the electrical signal, and outputting the analog signal;
an analog-to-digital converter configured to convert the analog signal into a digital signal;
a latch configured to latch the digital signal; and
a column decoder for generating a second decoding signal based on the latched digital signal, and outputting the second decoding signal to an image signal processing for processing.

11. An image processing system comprising:
the image sensor of claim 1 configured to generate electrical signals based on an optical image;
a processor configured to process the electrical signals output from the sensor to generate an image.

12. The image sensor of claim 1, wherein the plurality of dummy gates is arranged in a same pattern as the plurality of readout elements.

13. An image sensor, comprising:
a substrate including at least a first and a second dual-lobed active region, the first and the second dual-lobed active region spatially isolated from each other;
a first transfer gate formed between each lobe of the first dual-lobed active region and a first connection active region of the first dual-lobed active region;
a plurality of readout elements formed on an axis active region of the first dual-lobed active region;
a second transfer gate formed between each lobe of the second dual-lobed active region and a second connection active region of the second dual-lobed active region; and
at least one dummy gate group including at least one dummy gate formed in an element isolation region adjacent to the second connection active region,
wherein the at least one dummy group is between the second connection active region and a dummy active region.

* * * * *